United States Patent
Vasilevsky

(10) Patent No.: US 9,420,715 B2
(45) Date of Patent: Aug. 16, 2016

(54) ELECTRONONIC EQUIPMENT BUILDING BLOCKS FOR RACK MOUNTING

(71) Applicant: INTAL TECH LTD., Rishon Lezion (IL)

(72) Inventor: Alexander Vasilevsky, Rishon Lezion (IL)

(73) Assignee: INTAL TECH LTD., Rishon Lezion (IL)

( * ) Notice: Subject to any disclaimer, the term of this patent is extended or adjusted under 35 U.S.C. 154(b) by 0 days.

(21) Appl. No.: 14/406,244

(22) PCT Filed: Jun. 5, 2013

(86) PCT No.: PCT/IB2013/054627
§ 371 (c)(1),
(2) Date: Dec. 8, 2014

(87) PCT Pub. No.: WO2013/183011
PCT Pub. Date: Dec. 12, 2013

(65) Prior Publication Data
US 2015/0122751 A1  May 7, 2015

Related U.S. Application Data

(60) Provisional application No. 61/656,708, filed on Jun. 7, 2012.

(51) Int. Cl.
*A47F 7/00* (2006.01)
*H05K 7/14* (2006.01)
*H04Q 1/02* (2006.01)

(52) U.S. Cl.
CPC .. *H05K 7/14* (2013.01); *H04Q 1/09* (2013.01); *H05K 7/1492* (2013.01)

(58) Field of Classification Search
CPC .......... H05K 7/14; H05K 7/1492; H04Q 1/09
USPC ........ 211/26, 26.2; 439/532, 534, 713, 540.1; 312/223.1, 265.1–265.4; 174/50; 361/807, 809–810
See application file for complete search history.

(56) References Cited

U.S. PATENT DOCUMENTS 1,881,503 A * 10/1932 Graham .................... H05K 7/18
361/829
3,548,261 A * 12/1970 Chambers ............ G09B 23/185
361/807

(Continued)

FOREIGN PATENT DOCUMENTS

DE 202009013171 * 1/2010 .............. H04L 12/10
EP 0703722 A2 3/1996
EP 1835794 A2 9/2007

*Primary Examiner* — Joshua J Michener
*Assistant Examiner* — Devin Barnett
(74) *Attorney, Agent, or Firm* — Roach Brown McCarthy & Gruber, P.C.; Kevin D. McCarthy

(57) ABSTRACT

A rack-mountable module assembly, comprising: a plurality of electronic equipment modules, each having a height in multiples of approximately 1.75 inches and a width in multiples of approximately 1.75 inches; a plurality of connectors configured to form a horizontal row of said plurality of electronic equipment modules, by connecting every two adjacent modules of said plurality of electronic equipment modules to each other; and a pair of side mounts configured to connect the horizontal row to a frame of the rack.

10 Claims, 8 Drawing Sheets

(56) References Cited

U.S. PATENT DOCUMENTS

| | | | | | |
|---|---|---|---|---|---|
| 4,227,238 A * | 10/1980 | Saito | H05K 1/148 | | |
| | | | 200/296 | | |
| 4,502,101 A * | 2/1985 | Jodoin | H01G 2/06 | | |
| | | | 361/306.2 | | |
| 4,507,707 A * | 3/1985 | Willis | F15B 13/0814 | | |
| | | | 137/884 | | |
| 4,578,697 A * | 3/1986 | Takemae | H01L 23/057 | | |
| | | | 257/703 | | |
| 4,667,270 A * | 5/1987 | Yagi | H01R 33/88 | | |
| | | | 257/E25.028 | | |
| 5,209,356 A * | 5/1993 | Chaffee | H05K 7/1425 | | |
| | | | 211/26 | | |
| 5,343,365 A * | 8/1994 | Lueneburger | H01H 50/14 | | |
| | | | 361/773 | | |
| 5,367,437 A * | 11/1994 | Anderson | H01G 4/38 | | |
| | | | 257/533 | | |
| 5,639,261 A * | 6/1997 | Rutkowski | G02B 6/4452 | | |
| | | | 439/31 | | |
| 5,647,763 A * | 7/1997 | Arnold | G02B 6/3897 | | |
| | | | 439/532 | | |
| 5,779,504 A * | 7/1998 | Dominiak | H01R 9/2408 | | |
| | | | 439/532 | | |
| 5,786,987 A * | 7/1998 | Barbier | H05K 7/1477 | | |
| | | | 361/728 | | |
| 5,982,636 A * | 11/1999 | Stahl | H05K 3/326 | | |
| | | | 174/255 | | |
| 5,986,894 A * | 11/1999 | Lint | H01F 17/062 | | |
| | | | 336/229 | | |
| 6,115,885 A * | 9/2000 | Strickler | E05D 7/10 | | |
| | | | 16/265 | | |
| 6,122,170 A * | 9/2000 | Hirose | C04B 37/026 | | |
| | | | 174/16.3 | | |
| 6,137,688 A * | 10/2000 | Borkar | G06F 1/183 | | |
| | | | 174/363 | | |
| 6,222,731 B1 * | 4/2001 | Katsui | H01L 23/40 | | |
| | | | 165/121 | | |
| 6,281,695 B1 * | 8/2001 | Chung | G01R 1/0408 | | |
| | | | 257/48 | | |
| 6,356,458 B1 * | 3/2002 | Andreassen | H05K 7/1461 | | |
| | | | 361/715 | | |
| 6,504,726 B1 * | 1/2003 | Grabinger | H05K 1/0228 | | |
| | | | 361/796 | | |
| 6,537,106 B1 * | 3/2003 | Follingstad | H01R 13/518 | | |
| | | | 439/534 | | |
| 6,677,520 B1 * | 1/2004 | Kim | G02B 6/4453 | | |
| | | | 174/50 | | |
| 6,683,252 B2 * | 1/2004 | Sobel | H05K 7/1409 | | |
| | | | 174/135 | | |
| 6,711,810 B2 * | 3/2004 | Buley | H05K 3/303 | | |
| | | | 257/776 | | |
| 6,757,179 B2 * | 6/2004 | Barsun | G06F 1/184 | | |
| | | | 257/718 | | |
| 6,929,517 B2 * | 8/2005 | Tsai | H01R 4/363 | | |
| | | | 439/527 | | |
| 7,271,335 B2 * | 9/2007 | Dinh | H02G 3/125 | | |
| | | | 174/50 | | |
| 7,335,056 B1 * | 2/2008 | Clark | H01R 13/518 | | |
| | | | 439/534 | | |
| 7,371,109 B2 * | 5/2008 | Verding | H04Q 1/13 | | |
| | | | 439/532 | | |
| 7,372,701 B2 * | 5/2008 | Jacobson | H05K 7/026 | | |
| | | | 165/185 | | |
| 7,534,958 B2 * | 5/2009 | McNutt | G02B 6/3897 | | |
| | | | 174/101 | | |
| 7,562,779 B2 * | 7/2009 | Bravo | H05K 7/1449 | | |
| | | | 211/26 | | |
| 7,582,827 B1 * | 9/2009 | Gretz | H02G 3/121 | | |
| | | | 174/481 | | |
| 7,642,456 B2 * | 1/2010 | Baba | H01H 85/2045 | | |
| | | | 174/17 R | | |
| 7,782,630 B2 * | 8/2010 | Kajio | H05K 1/0263 | | |
| | | | 361/788 | | |
| 7,829,787 B2 * | 11/2010 | Hruby | G02B 6/4459 | | |
| | | | 174/50 | | |
| 7,885,080 B2 * | 2/2011 | Janisch | H05K 1/142 | | |
| | | | 361/757 | | |
| 8,094,675 B2 * | 1/2012 | Spivey | H04L 45/00 | | |
| | | | 370/419 | | |
| 8,189,348 B2 * | 5/2012 | Kadivar | H05K 7/142 | | |
| | | | 361/807 | | |
| 8,212,144 B1 * | 7/2012 | Gretz | H02G 3/12 | | |
| | | | 174/480 | | |
| 8,295,061 B2 * | 10/2012 | Kim | H05K 7/142 | | |
| | | | 361/807 | | |
| 8,305,739 B2 * | 11/2012 | Dozier | H02B 1/056 | | |
| | | | 174/50 | | |
| 8,335,089 B2 * | 12/2012 | Takahashi | H05K 5/02 | | |
| | | | 361/755 | | |
| 8,378,211 B2 * | 2/2013 | Oka | H02G 3/086 | | |
| | | | 174/50 | | |
| 8,404,974 B1 * | 3/2013 | O'Connor | H01R 4/2433 | | |
| | | | 174/100 | | |
| 8,433,171 B2 * | 4/2013 | Cooke | G02B 6/4453 | | |
| | | | 385/135 | | |
| 8,456,814 B2 * | 6/2013 | Gerovac | H02B 1/301 | | |
| | | | 174/50 | | |
| 8,585,437 B2 * | 11/2013 | Lin | H01R 13/518 | | |
| | | | 439/532 | | |
| 8,605,450 B2 * | 12/2013 | Kaneshige | H10M 2/1072 | | |
| | | | 361/730 | | |
| 8,611,102 B2 * | 12/2013 | Zeng | G06F 1/184 | | |
| | | | 361/679.07 | | |
| 8,717,776 B2 * | 5/2014 | Colongo | H05K 7/1449 | | |
| | | | 29/825 | | |
| 8,723,033 B2 * | 5/2014 | Hara | B60R 16/0238 | | |
| | | | 174/17 R | | |
| 8,749,956 B2 * | 6/2014 | Guering | H02B 1/044 | | |
| | | | 307/18 | | |
| 8,821,004 B2 * | 9/2014 | Kuo | G02F 1/1333 | | |
| | | | 361/807 | | |
| 8,840,426 B2 * | 9/2014 | Pepe | H01R 13/40 | | |
| | | | 439/540.1 | | |
| 8,908,356 B2 * | 12/2014 | Wang | H01H 85/20 | | |
| | | | 174/50 | | |
| 8,929,083 B2 * | 1/2015 | Cox | H05K 7/20963 | | |
| | | | 312/223.5 | | |
| 8,947,884 B1 * | 2/2015 | Grimm | H05K 7/142 | | |
| | | | 361/679.31 | | |
| 8,947,891 B2 * | 2/2015 | Hsiao | G02F 1/133608 | | |
| | | | 361/807 | | |
| 8,993,900 B2 * | 3/2015 | Yamazaki | 174/50 | | |
| 2002/0018340 A1 * | 2/2002 | Okamoto | H04B 1/38 | | |
| | | | 361/807 | | |
| 2002/0153152 A1 * | 10/2002 | Jarasse | H01H 9/168 | | |
| | | | 174/50 | | |
| 2002/0157844 A1 * | 10/2002 | Laflamme | H02G 3/123 | | |
| | | | 174/50 | | |
| 2002/0157848 A1 * | 10/2002 | Chiriku | B60R 16/0238 | | |
| | | | 174/50 | | |
| 2002/0185293 A1 * | 12/2002 | English | H02G 3/185 | | |
| | | | 174/50 | | |
| 2003/0092314 A1 * | 5/2003 | Whiteside | H01R 9/2491 | | |
| | | | 439/540.1 | | |
| 2004/0011750 A1 * | 1/2004 | Kim | G02B 6/4452 | | |
| | | | 211/26 | | |
| 2004/0047137 A1 * | 3/2004 | Quero | H02B 1/043 | | |
| | | | 361/807 | | |
| 2005/0047049 A1 * | 3/2005 | Bell | H04Q 1/116 | | |
| | | | 361/118 | | |
| 2005/0186838 A1 * | 8/2005 | Debenedictis | H01R 13/6461 | | |
| | | | 439/540.1 | | |
| 2005/0221677 A1 * | 10/2005 | Hammond, Jr. | H01R 13/6461 | | |
| | | | 439/676 | | |
| 2006/0043031 A1 * | 3/2006 | Rinderer | H05K 7/186 | | |
| | | | 211/26 | | |
| 2006/0061980 A1 * | 3/2006 | Shimizu | H05K 3/365 | | |
| | | | 361/807 | | |
| 2006/0114663 A1 * | 6/2006 | Kim | H05K 5/02 | | |
| | | | 361/807 | | |
| 2006/0160431 A1 * | 7/2006 | Herbst | H04Q 1/068 | | |
| | | | 439/713 | | |
| 2006/0162948 A1 * | 7/2006 | Rinderer | H05K 7/186 | | |
| | | | 174/50 | | |

(56) References Cited

U.S. PATENT DOCUMENTS

| | | | | |
|---|---|---|---|---|
| 2006/0168759 A1* | 8/2006 | Laursen | H04Q 1/09 | 163/358 |
| 2006/0180555 A1* | 8/2006 | Shih | H05K 7/1489 | 211/26 |
| 2006/0180556 A1* | 8/2006 | Shih | H05K 7/1489 | 211/26 |
| 2006/0185880 A1* | 8/2006 | Shin | H02G 3/0475 | 174/50 |
| 2007/0238365 A1* | 10/2007 | Hammond, Jr. | H01R 13/6658 | 439/676 |
| 2007/0298652 A1* | 12/2007 | Clark | H04Q 1/131 | 439/540.1 |
| 2008/0020632 A1* | 1/2008 | Gorman | H02G 3/125 | 439/535 |
| 2008/0096438 A1* | 4/2008 | Clark | H01R 13/518 | 439/713 |
| 2008/0174979 A1* | 7/2008 | Furihata | H05K 1/0269 | 361/807 |
| 2008/0218956 A1* | 9/2008 | Bang | H05K 7/20963 | 361/679.02 |
| 2008/0280500 A1* | 11/2008 | Martich | H01R 13/514 | 439/676 |
| 2009/0009980 A1* | 1/2009 | Ward | H02M 7/003 | 361/807 |
| 2009/0239413 A1* | 9/2009 | Milette | H01R 13/518 | 439/540.1 |
| 2009/0316371 A1* | 12/2009 | Kim | H05K 5/0217 | 361/752 |
| 2010/0218004 A1* | 8/2010 | Cousy | H04L 12/10 | 713/300 |
| 2010/0221950 A1* | 9/2010 | Pepe | H01R 13/40 | 439/607.05 |
| 2010/0224578 A1* | 9/2010 | Fariello | H04Q 1/068 | 211/26 |
| 2010/0255716 A1* | 10/2010 | Frey | H04Q 1/13 | 439/540.1 |
| 2010/0302754 A1* | 12/2010 | Nordin | G02B 6/4452 | 361/810 |
| 2010/0314339 A1* | 12/2010 | Laursen | H04Q 1/09 | 211/26 |
| 2011/0045691 A1* | 2/2011 | Su | H01R 13/518 | 439/540.1 |
| 2011/0056895 A1* | 3/2011 | Tichy | H04Q 1/10 | 211/26 |
| 2011/0136372 A1* | 6/2011 | Heckmann | A61F 2/4081 | 439/404 |
| 2011/0155454 A1* | 6/2011 | Cheng | H05K 9/0066 | 174/551 |
| 2011/0189886 A1* | 8/2011 | Chen | H04Q 1/13 | 439/488 |
| 2011/0253647 A1* | 10/2011 | Yu | H05K 7/1491 | 211/26 |
| 2012/0033396 A1* | 2/2012 | Goedknegt | H02B 1/28 | 361/807 |
| 2012/0051022 A1* | 3/2012 | Dong | G02F 1/133308 | 361/807 |
| 2012/0099268 A1* | 4/2012 | Hartman | G06F 1/183 | 361/679.32 |
| 2012/0132454 A1* | 5/2012 | Miyamoto | B60R 16/0238 | 174/50 |
| 2012/0162950 A1* | 6/2012 | Liu | G06F 1/1637 | 361/807 |
| 2012/0168392 A1* | 7/2012 | Franklin-Lees | H05K 7/183 | 211/26 |
| 2012/0199373 A1* | 8/2012 | Uchida | B60R 16/0238 | 174/50 |
| 2012/0308189 A1* | 12/2012 | Kimbrell | G02B 6/4471 | 385/135 |
| 2013/0003299 A1* | 1/2013 | Wissner | H02M 7/003 | 361/695 |
| 2013/0062091 A1* | 3/2013 | John | H01R 12/7023 | 174/59 |
| 2013/0098653 A1* | 4/2013 | Maccarone | H02G 3/086 | 174/50 |
| 2013/0100632 A1* | 4/2013 | Ibori | H02M 7/003 | 361/807 |
| 2013/0215581 A1* | 8/2013 | Utz | H05K 3/325 | 361/752 |
| 2013/0220953 A1* | 8/2013 | Liang | H05K 7/1488 | 211/26 |
| 2013/0277512 A1* | 10/2013 | He | G11B 33/124 | 248/213.2 |
| 2013/0292151 A1* | 11/2013 | Leifer | H01F 38/30 | 174/50 |
| 2013/0306579 A1* | 11/2013 | Plutt | G11B 17/225 | 211/26 |
| 2014/0060915 A1* | 3/2014 | Liang | H05K 7/1492 | 174/520 |
| 2015/0282372 A1* | 10/2015 | Sakurai | H05K 7/1487 | 361/679.02 |
| 2015/0289405 A1* | 10/2015 | Stewart | H05K 7/183 | 211/26 |

\* cited by examiner

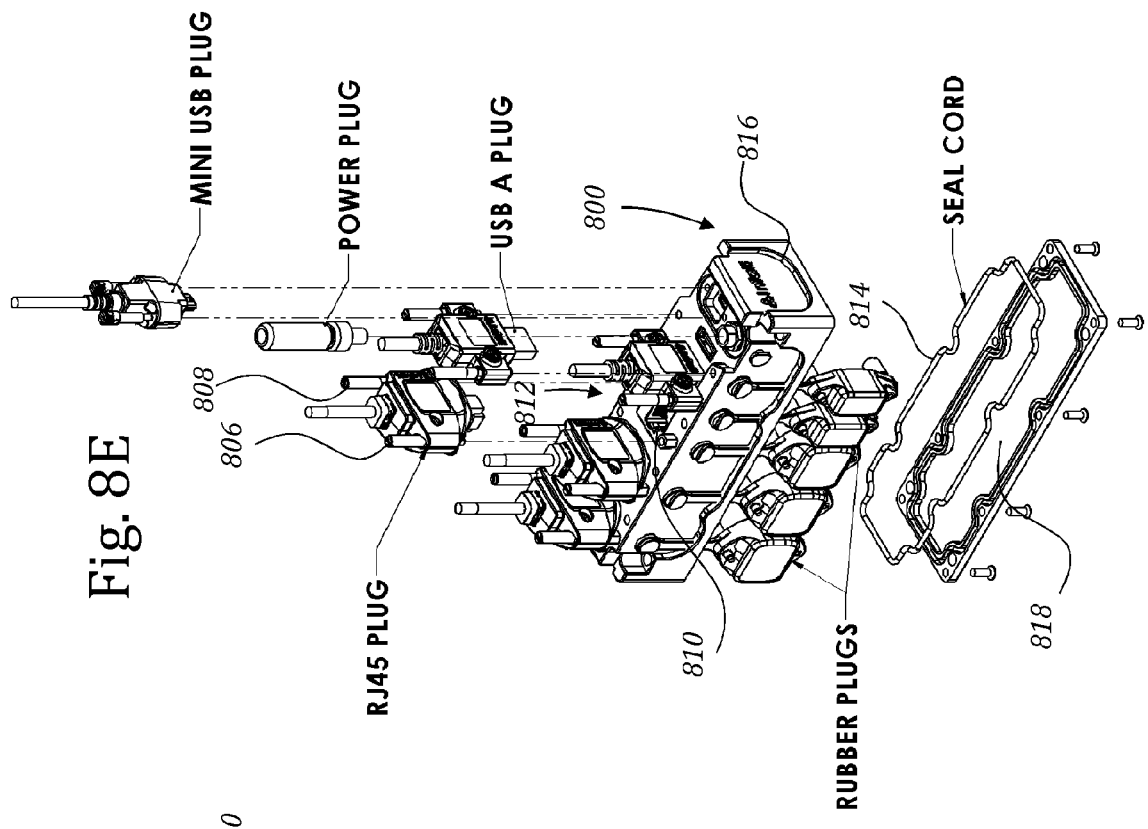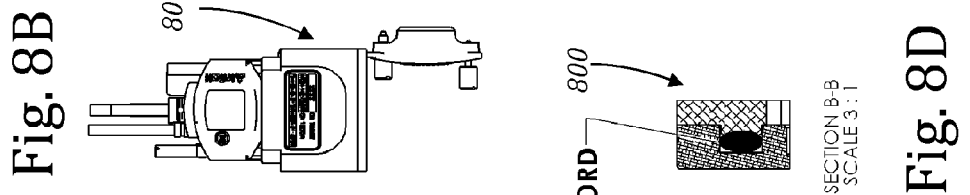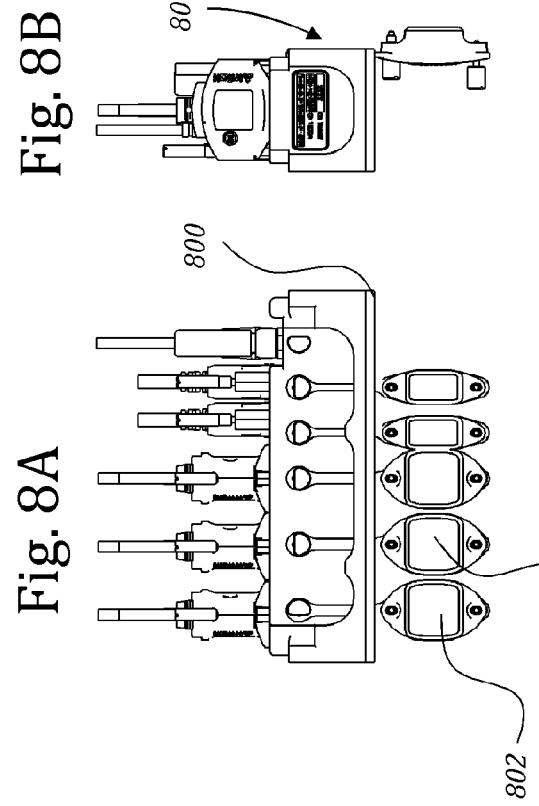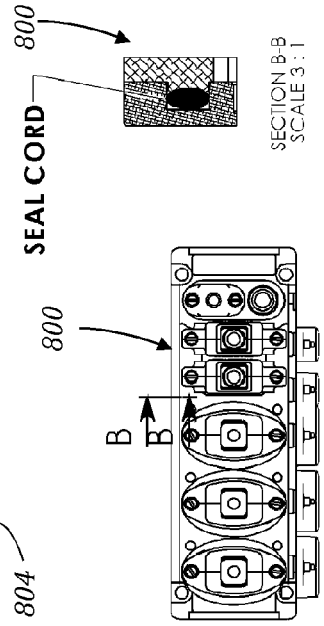

ELECTRONONIC EQUIPMENT BUILDING BLOCKS FOR RACK MOUNTING

FIELD OF THE INVENTION

The invention relates to electronic equipment building blocks for rack mounting.

BACKGROUND

A rack is often defined as a standardized frame or enclosure for mounting multiple electronic equipment modules, such as network equipment, computer servers, audio/video equipment and/or the like. Racks typically come in one of two sizes: 19-inch or 23-inch. This size refers to the width of the equipment that can be mounted inside the rack. Differently-sized racks are also possible.

A rack unit "U" (sometimes also referred to as "RU") is a unit of measurement defining the height of equipment intended for mounting in a rack. One rack unit, as accepted today, is 1.75 inches (44.45 mm) high. Rack equipment is usually manufactured with a height in multiples of U, such as "1U", "2U" and so on. A typical full-size rack measures 44U, while a typical "half-height" rack, or "half-rack", would usually have a height of between 18U and 24U. The term "half-rack", however, may be used differently in different situations. For example, "half-rack" may refer to equipment width; a "half-rack" equipment module may have a width of 9.5 inches (half of 19 inches) or 11.5 inches (half of 23 inches). In other situations, "half-rack" may refer to equipment depth, namely—two "half-rack" modules may be mounted one behind the other.

Formal standards for the more common 19-inch (482.6 mm) rack include the following, which are incorporated herein by reference in their entirety:

Electronic Industries Alliance EIA-310-D, Cabinets, Racks, Panels, and Associated Equipment, dated September 1992. (Latest Standard Now REV E 1996).

Consumer Electronics Association CEA-310-E design requirements for Cabinets, Panels, Racks and Subracks, dated Dec. 14, 2005.

International Electrotechnical Commission—IEC 60297 Mechanical structures for electronic equipment.

SUMMARY

The following embodiments and aspects thereof are described and illustrated in conjunction with systems, tools and methods which are meant to be exemplary and illustrative, not limiting in scope.

There is provided, in accordance with an embodiment, a rack-mountable module assembly, comprising: a plurality of electronic equipment modules, each having a height in multiples of approximately 1.75 inches and a width in multiples of approximately 1.75 inches; a plurality of connectors configured to form a horizontal row of said plurality of electronic equipment modules, by connecting every two adjacent modules of said plurality of electronic equipment modules to each other; and a pair of side mounts configured to connect the horizontal row to a frame of the rack.

There is further provided, in accordance with an embodiment, a rack-mountable module assembly, comprising: a plurality of electronic equipment modules, each having a height in multiples of approximately 1.75 inches and a width in multiples of approximately 1.75 inches; a horizontal back panel extending to an entire width of the rack and configured to connect to a frame of the rack; and a plurality of connectors configured to form a horizontal row of said plurality of electronic equipment modules, by connecting each of said plurality of electronic equipment modules to said horizontal back panel.

In some embodiments, said plurality of connectors comprises a plurality of back-access connectors, thereby providing for a clean appearance of a front side of the horizontal row.

In some embodiments, said plurality of back-access connectors comprises a plurality of I-shaped connectors.

In some embodiments, each of said plurality of H-shaped connectors comprises at least for holes, and wherein the assembly further comprises at least four screws for each for of said plurality of I-shaped connectors, wherein said at least four screws are configured for threading from a back side of the rack, through two electronic equipment modules of said plurality of electronic equipment modules, and into said at least four holes.

In some embodiments, at least some of said plurality of connectors are further configured to vertically mount one or more additional electronic equipment modules to said horizontal row.

In some embodiments, said horizontal row, together with said pair of side mounts, are configured to match a rack having a width of approximately 19 inches.

In some embodiments, said horizontal row, together with said pair of side mounts, are configured to match a rack having a width of approximately 23 inches.

In some embodiments, at least some of said plurality of electronic equipment modules each has a cubic shape.

In some embodiments, at least some of said plurality of electronic equipment modules each comprises a peg and a cover connected to said peg.

In some embodiments, each of said plurality of electronic equipment modules comprises one or more plugs selected from the group consisting of: a Universal Serial Bus (USB) plug, an RJ45 plug and a power plug.

In some embodiments, said plurality of electronic equipment modules comprises at least one USB-to-serial adapter.

In some embodiments, said plurality of electronic equipment modules comprises at least one power-over-Ethernet injector.

In some embodiments, said plurality of electronic equipment modules comprises at least one network switch.

In some embodiments, the rack-mountable module assembly further comprises a vertical back panel configured to vertically mount one or more additional electronic equipment modules to said horizontal row.

In some embodiments, said horizontal back panel comprises at least one vertical protrusion configured for mounting one or more additional electronic equipment modules to said horizontal row.

In some embodiments, said horizontal back panel is configured to match a rack having a width of approximately 19 inches.

In some embodiments, said horizontal back panel is configured to match a rack having a width of approximately 23 inches.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIGS. 8A-E show the exemplary $3U^2$ module of FIG. 6 in top, side, front, cross-sectional and exploded views.

DETAILED DESCRIPTION

An aspect of some embodiments relates to modules of electronic equipment which are structured and sized to serve as building blocks for mounting in a rack. Each module may have a width smaller than the standard 19 or 23 inches-wide rack, such that multiple modules, either ones of the same type or of different types, may be mounted in the rack side-by-side. A further aspect relates to advantageous connectors structured for connecting adjacent modules. These modules and connectors, alone or in combination, enable the highly-modular mounting of similar or different electronic modules; the modules may be assembled together using the connectors, for filling a standard 19 or 23 inch width according to the user's preferences and needs. Removal or replacement of a mounted module is convenient and efficient.

Figure 1:
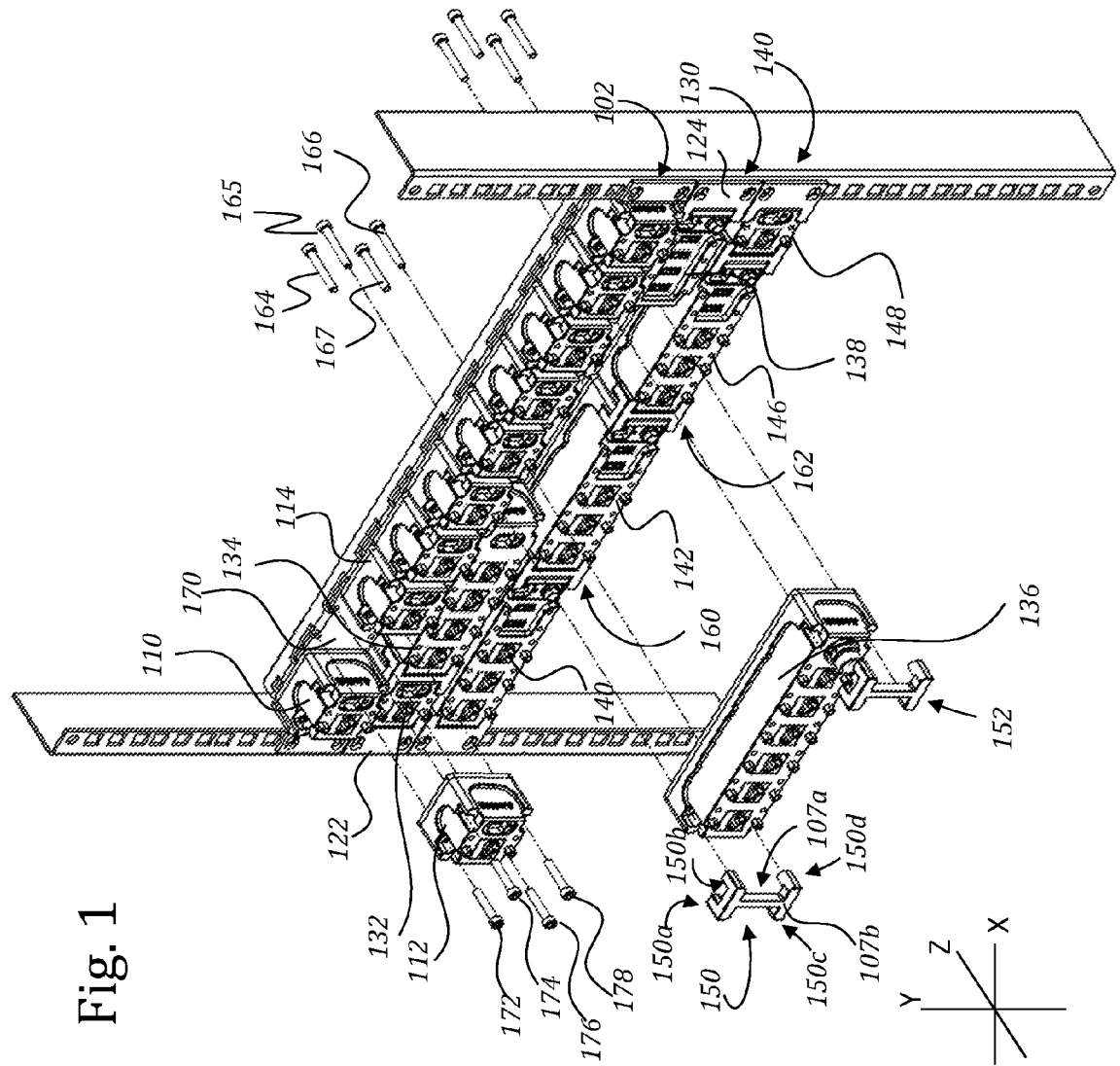
FIG. 1 shows a perspective view of a rack with exemplary modules of electronic equipment which serve as building blocks.
Figure 2:
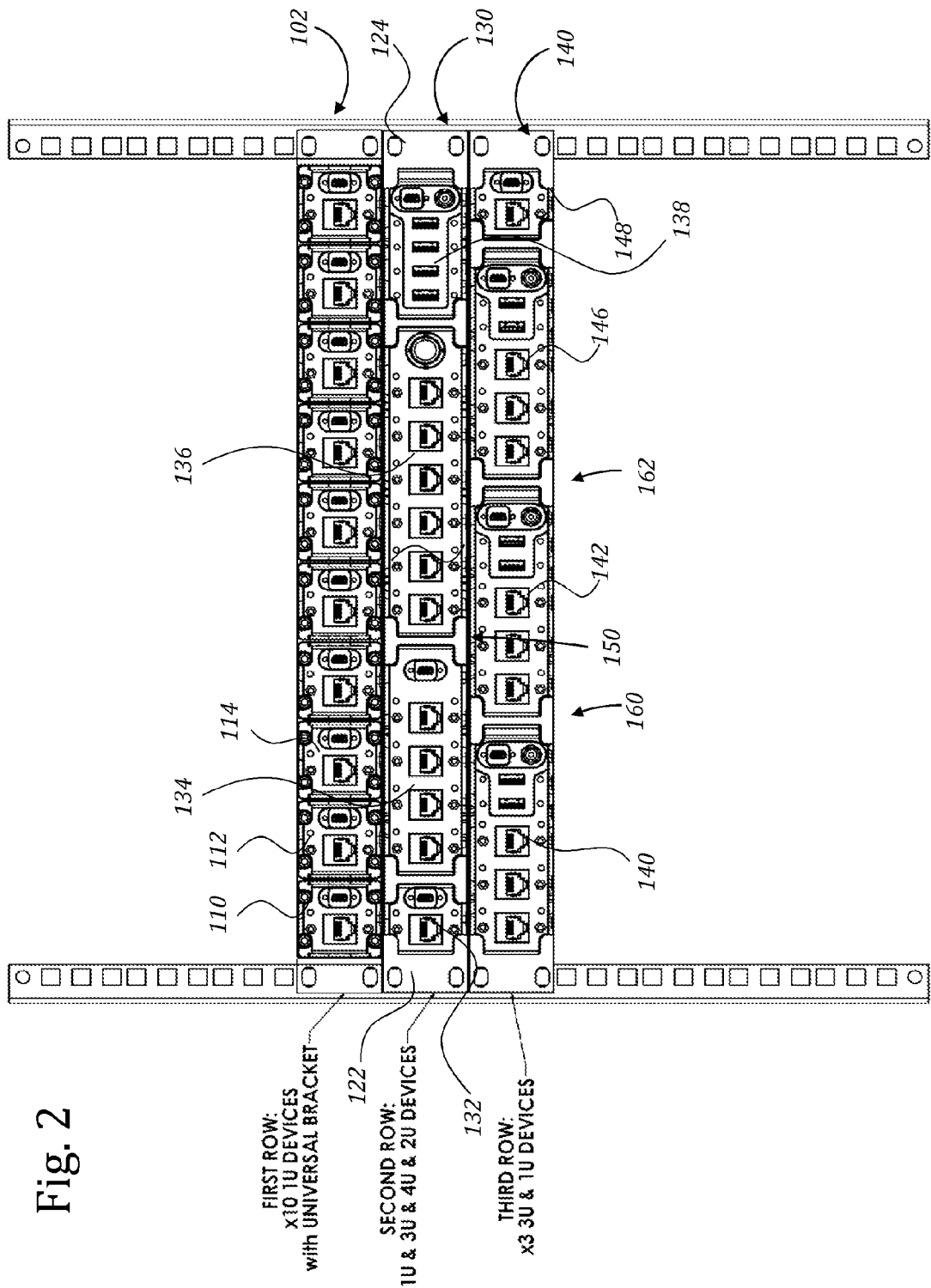
FIG. 2 shows a front view of the rack of FIG. 1.

Reference is now made to FIGS. 1 and 2, which show a rack with an exemplary assembly of modules connected to its frame, in exploded and front views, respectively. The components of this exemplary assembly, as well as their positioning, are shown as an illustrative example only. Due to the high modularity of the disclosed modules and connectors, numerous other options are possible.

Optionally, the height of some or all of the disclosed modules is approximately (±10%) U or multiples of U. Further optionally, the width of some or all of the disclosed modules is approximately U or multiples of U. In some embodiments, such as in the example of FIGS. 1 and 2, the height of the modules is U, and their width is U or multiples of U. Accordingly, modules of these embodiments may be referred to as measuring $U^2$ or its multiples ($2U^2$, $3U^2$ etc.). The depth dimension of such modules may be of any measurement, U or different. For example, modules 110, 112 and 114, as well as the other modules of a first horizontal row 102, measure $U^2$ (height×width). Ten such modules are shown, for a total width of approximately 10U (17.5 inch). Since the shown rack is of a 19 inch width, approximately 1.5 inches remain. However, since each of the modules may be approximately U-wide, their actual width may be slightly larger than exactly U, such that the 19 inches are reached. Additionally or alternatively, a pair of side mounts, such as side mounts 122 and 124 may be provided, and may close any remaining gaps by connecting the two most extreme modules in each row to the frame of the rack. Similar considerations apply when the rack is 23 inches.

A second horizontal row 130 of modules may include, as an example, a $1U^2$ module 132, a $3U^2$ module 134, a $4U^2$ module 136 and a $1U^2$ module 138. A third horizontal row 140 of modules may be comprised of three $3U^2$ modules 142, 144 and 146, and a $1U^2$ module 148.

In some embodiments, the attachment of the modules to one another and/or their fixation to the rack may be made using special connectors, such as I-shaped connectors 150 and 152 of second row 130 and connectors 160 and 162 of third row 140. This type of connectors may be referred to as "back access" connectors, since they require access to the back side of the rack for threading screws, such as screws 164, 165, 166 and/or 167, through each module and into the connector. This may be desired, for example, when a clean appearance of the front side of the rack and the horizontal row of modules is needed; the connectors hide the screws.

In some embodiments, the fixation of the modules to the rack may be made using a back panel, such as back panel 170, which extends to the entire width of the rack and connects to it on both sides. Then, modules such as modules 110, 112 and 114, as well as other modules of first row 102, may be affixed to back panel 170 using screws, such as screws 172, 174, 176 and/or 178, which are threaded from the front side of the rack. The appearance of first row 102 may be less appealing than that of second 130 and third 140 rows which use the back access connectors, but mounting and mounting of modules may be easier in the case of first row 102, where front access is enabled.

In some embodiments (not shown), a rack-mountable assembly of modules may also include vertical mounting of modules, instead of or in addition to the horizontal-only mounting discussed above.

If the attachment of the modules to one another is done by connectors, for example as by connectors similar to connectors 150, 152, 160 and 162, such connectors and their associated modules may be configured to connect modules one above or below the other, vertically.

If the attachment of the modules to one another is done by connecting them to a back panel which holds them together, for example a back panel similar to back panel 170, then such back panel may be configured to connect modules one above or below the other, vertically. Namely, such back panel may be shaped as a horizontal panel with one or more vertical protrusions, erecting upwards or downwards. Additionally or alternatively, one or more separate, vertical back panels, may be used to connect modules one above or below the other.

Figure 3:
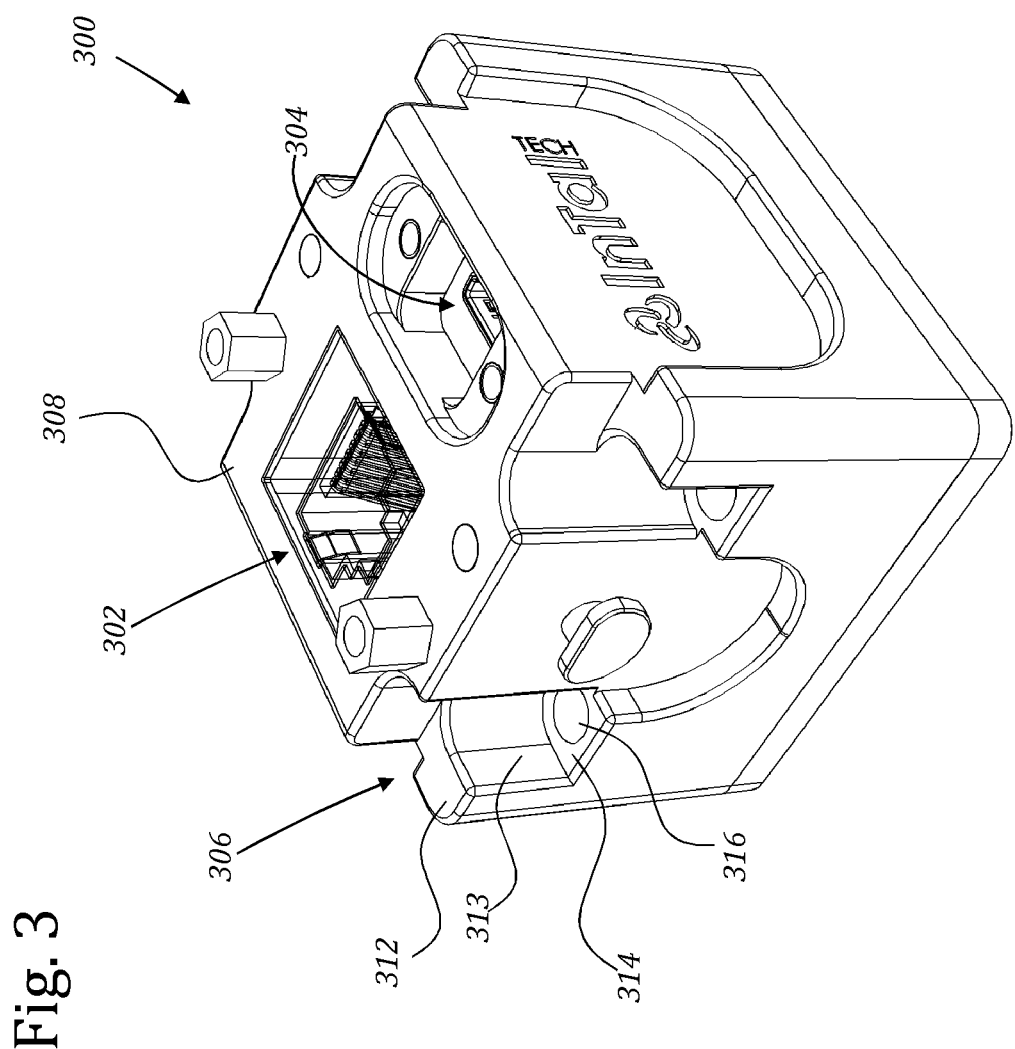
FIG. 3 shows a perspective view of an exemplary $1U^2$ module.

Reference is now made to FIG. 3, which shows an exemplary $1U^2$ module 300, which may be, for example, module 114 of FIGS. 1 and 2, having an RJ45 socket 302 and a mini USB socket 304, serving here merely as an example. Module 300 may have a generally cubic shape. One or more corners of module 300 may have a recess, such as recess 306, extending from a front facet 308 of the module towards the back of the module. Recess 306 may include two differently-leveled plateaus, a high plateau 312 and a low plateau 314. Low plateau 314 may have a bore 316 through which a screw may be threaded from the front or the back, depending if front access or back access is desired.

A vertical surface 313 between plateaus 312 and 314 may serve as a support for a connector connecting between module 300 and an adjacent module. Referring now back to FIG. 1, an exemplary connector, such as an I-shaped connector 150, may include two top protrusions 150a-b and two bottom protrusions 150c-d. One or more of each of top protrusions 150a-b and bottom protrusions 150c-d may include a bore (not shown), extending from a back side 107a of the connector towards the front, but ending within the body of the connector and not exiting from its front facet 107b. A screw may be threaded through a back side of a module, such as module 300, and into the bore, to affix the module to the connector.

When an adjacent module is connected to opposite protrusions of the same connector, each protrusion presses against vertical surface 313 of each of the modules, preventing them, together with the screw, from spreading apart. Persons of skill in the art will recognize that the I-shaped connector discussed here is merely an example of many types of connectors which may be used to connect adjacent modules and/or connect an end module to the rack.

FIGS. 4, 5, 6 and 7 show additional, exemplary types of electronic modules which are structured, similar to the above discussions, based on the $U^2$ principle.

Figure 4:
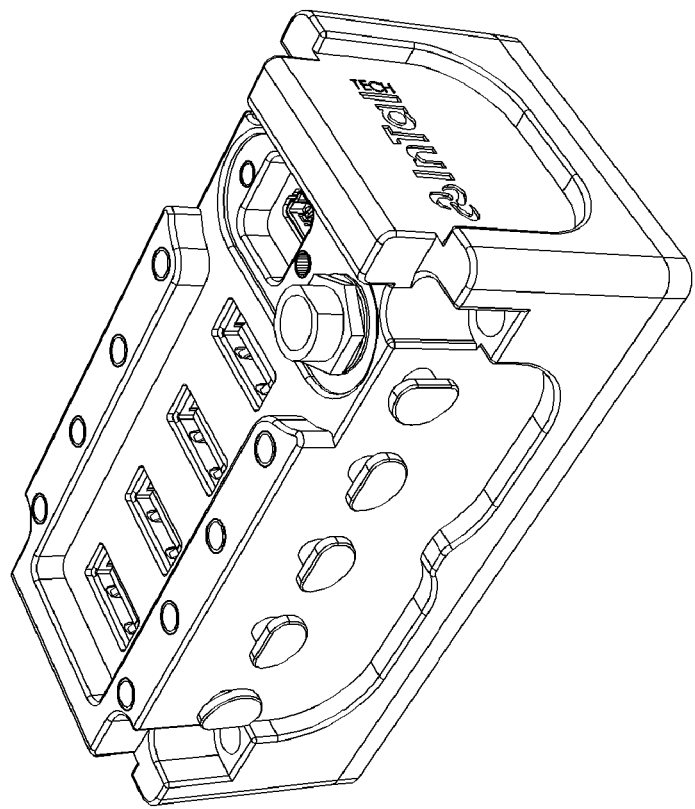
FIG. 4 shows a perspective view of an exemplary $2U^2$ module.

FIG. 4 shows a $2U^2$ module having 4 USB sockets, one mini USB socket and a power socket. This module may serve, for instance, as a USB hub.

Figure 5:
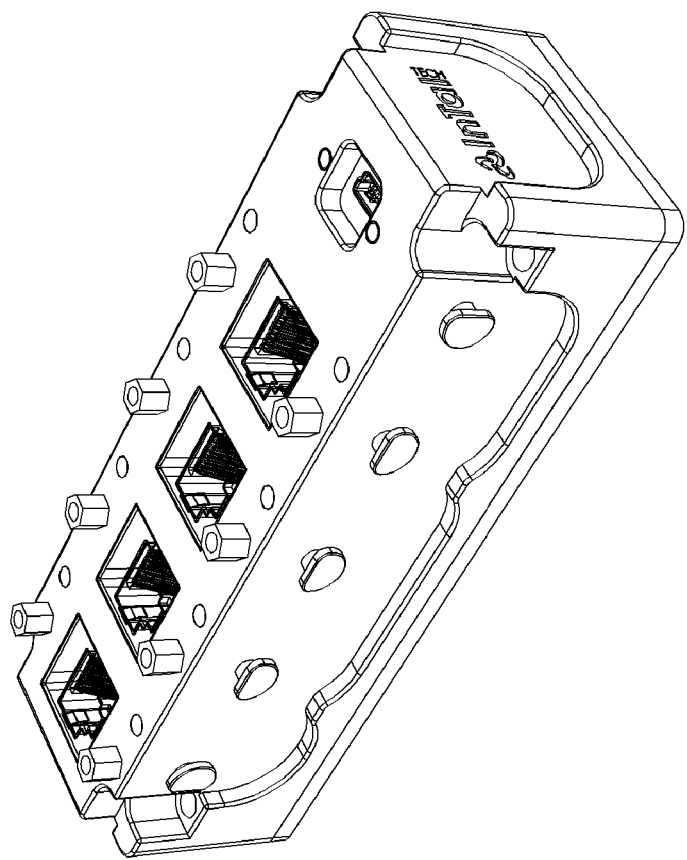
FIG. 5 shows a perspective view of an exemplary $3U^2$ module.

FIG. 5 shows a $3U^2$ module having 4 RJ45 sockets and a mini USB socket. This module may serve, for example, as a USB-to-serial adapter.

Figure 6:
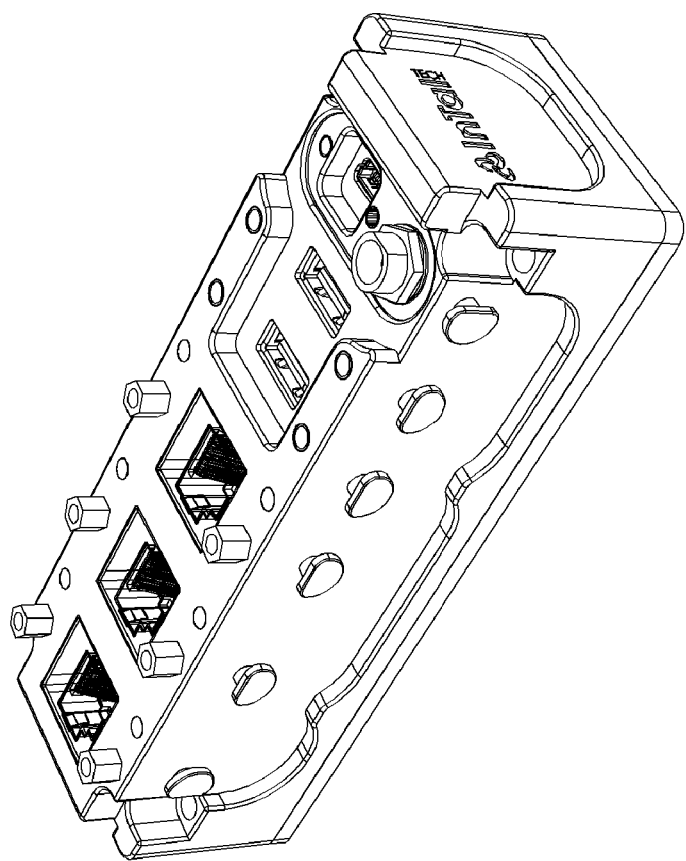
FIG. 6 shows a perspective view of an exemplary $3U^2$ module.

FIG. 6 shows a $3U^2$ module having 3 RJ45 sockets, 2 USB sockets, a mini USB socket and a power socket. This module may serve, for example, as a combined network switch/USB hub. Another option, for example, may be to use one of the RJ45 sockets for Ethernet and the other two, together with the USB sockets, as USB-to-serial adapters.

Figure 7:
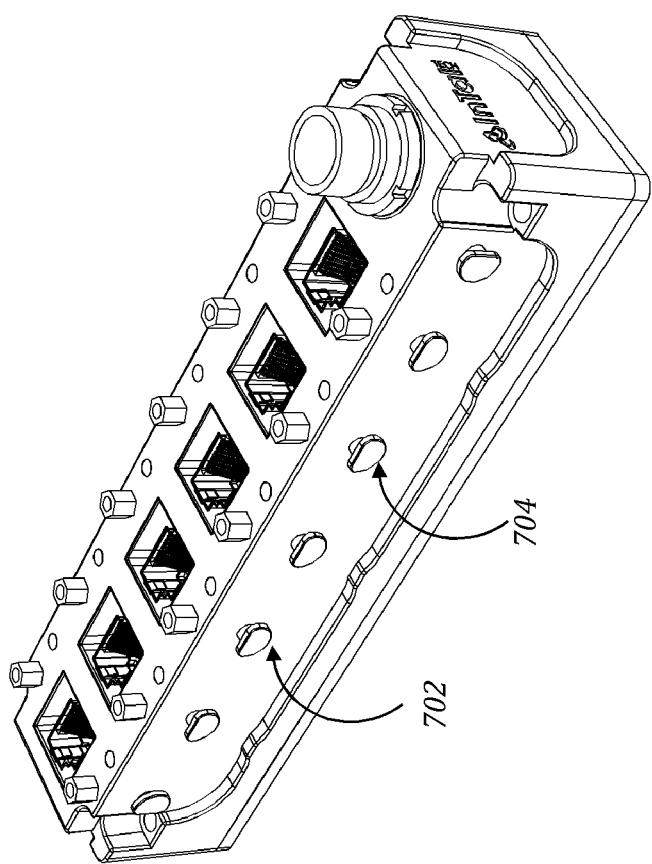
FIG. 7 shows a perspective view of an exemplary $4U^2$ module.

FIG. 7 shows a $4U^2$ module having 6 RJ45 sockets and a power socket. This module may serve, for example, as a network switch and/or a power-over-Ethernet injector.

Some or all of these exemplary modules and other, non-shown modules which are based on the same $U^2$ principle, may have a same corner configuration, enabling the connection of two adjacent modules using the disclosed I-shaped connector or a different connector. In addition, some or all of these exemplary modules and other, non-shown modules which are based on the same $U^2$ principle, may include one or more pegs, such as pegs 702 and 704 shown in FIG. 7. Such pegs may be provided on one or more sides of each module, and used to connect various covers, such as dust covers or the like, to the module. These covers may cover the various sockets on the front facet of the module, or sockets (invisible in the previous figures) at the back of each module.

Reference is now made to FIGS. 8A-E, which demonstrate the structure and configuration of an exemplary $3U^2$ module 800, similar to the $3U^2$ module of FIG. 6 which includes 3 RJ45 sockets, 2 USB sockets, one micro USB socket and a power socket. This $3U^2$ module is shown in multiple views, and serves here as an example of $U^2$ modules of different U-multiple widths.

Exemplary dust covers, such as those discussed above, are shown in these figures; for example, covers 802 and 804 of FIG. 8A.

FIGS. 8A-E further shows, as an example, 3 RJ45 plugs, 2 USB plugs, one micro USB plug and a power plug, all connected to $3U^2$ module 800. Both the plugs and their respective sockets may be of a hardened configuration, namely—be made of relatively rigid materials and structured to withstand conditions such as shock, dust and frequent manual connection and disconnection. Some or all of the plug types optionally include one or more screw fasteners, such as fasteners 806 and 808, which thread into corresponding screw holes 810 and 812 (hidden) in module 800. Matching circumferential seals, optionally of rubber or silicone. may be provided on each plug and its corresponding socket, to seal the electrical leads against dust, humidity and/or fluids.

In FIG. 8E, which is an exploded view of module 800, a sealing feature of the back side of the module itself is shown. A seal cord 814, made of rubber, silicone or the like may be positioned at least partially inside an open conduit in either a body 816 of module 800 or its bottom cover 818. An elongated, closed-circuit protrusion may be positioned opposite to the conduit, either in body 816 or in bottom cover 818, as may be the case, and have a matching shape. When bottom cover 818 is fastened to body 816, seal cord 814 is pressed between the conduit and the protrusion and seals module 800. The matching conduit-protrusion configuration may additionally provide enhanced EM (electromagnetic) shielding, since the EM-permeable seal cord 814 is surrounded by the conduit and the protrusion, blocking EM waves.

Module 800 may have, in general, enhanced EM shielding qualities. At least body 816 of module 800, and optionally its bottom cover 818, may be made of CNC-processed Aluminum (or a different suitable metal), so that solid material, with no gaps or non-hermetic connections, encompasses any electronic components residing inside the module.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

What is claimed is:

1. A rack-mountable module assembly, comprising:
   a plurality of electronic equipment modules, each having a height in multiples of approximately 1.75 inches and a width in multiples of approximately 1.75 inches;
   a plurality of connectors configured to form a horizontal row of said plurality of electronic equipment modules, by connecting every two adjacent modules of said plurality of electronic equipment modules to each other; and
   a pair of side mounts configured to connect the horizontal row to a frame, thereby forming a rack; wherein said plurality of connectors comprises a plurality of back-access connectors, thereby providing for a clean appearance of a front side of the horizontal row; wherein said plurality of back-access connectors comprises a plurality of I-shaped connectors; wherein each of said plurality of I-shaped connectors comprises at least four holes, and wherein the assembly further comprises at least four screws for each of said plurality of I-shaped connectors, wherein said at least four screws are configured for threading from a back side of the rack, through two electronic equipment modules of said plurality of electronic equipment modules, and into said at least four holes.

2. The rack-mountable module assembly according to claim 1, wherein at least some of said plurality of connectors are further configured to vertically mount one or more additional electronic equipment modules to said horizontal row.

3. The rack-mountable module assembly according to claim 1, wherein said horizontal row, together with said pair of side mounts, are configured to match a rack having a width of approximately 19 inches.

4. The rack-mountable module assembly according to claim 1, wherein said horizontal row, together with said pair of side mounts, are configured to match a rack having a width of approximately 23 inches.

5. The rack-mountable module assembly according to claim 1, wherein at least some of said plurality of electronic equipment modules each has a cubic shape.

6. The rack-mountable module assembly according to claim 1, wherein at least some of said plurality of electronic equipment modules each comprises a peg and a cover connected to said peg.

7. The rack-mountable module assembly according to claim 1, wherein each of said plurality of electronic equipment modules comprises one or more plugs selected from the group consisting of: a Universal Serial Bus (USB) plug, an RJ45 plug and a power plug.

8. The rack-mountable module assembly according to claim 1, wherein said plurality of electronic equipment modules comprises at least one USB-to-serial adapter.

9. The rack-mountable module assembly according to claim 1, wherein said plurality of electronic equipment modules comprises at least one power-over-Ethernet injector.

10. The rack-mountable module assembly according to claim 1, wherein said plurality of electronic equipment modules comprises at least one network switch.

* * * * *